United States Patent [19]

Steyert, Jr.

[11] 4,171,464
[45] Oct. 16, 1979

[54] HIGH SPECIFIC HEAT SUPERCONDUCTING COMPOSITE

[75] Inventor: William A. Steyert, Jr., Los Alamos, N. Mex.

[73] Assignee: The United State of America as represented by the U. S. Department of Energy, Washington, D.C.

[21] Appl. No.: 810,444

[22] Filed: Jun. 27, 1977

[51] Int. Cl.² .............. H01L 39/00; H01V 11/00
[52] U.S. Cl. .................. 174/126 S; 29/599; 148/11.5 Q; 174/128 S; 428/379; 428/545; 428/549; 428/551; 428/686
[58] Field of Search ............... 174/128 S, 126 S; 29/599, 192 R, 521, 419 R; 252/512, 518; 428/375, 379, 384, 549, 686, 551, 545; 75/206, 201, 230; 335/216

[56] References Cited

U.S. PATENT DOCUMENTS

| | | | |
|---|---|---|---|
| 3,428,925 | 2/1969 | Bogner et al. | 174/128 S |
| 3,514,850 | 6/1970 | Barber et al. | 174/128 S |
| 3,767,842 | 10/1973 | Bronca et al. | 174/128 S |
| 3,778,895 | 12/1973 | Nomura et al. | 174/126 S |
| 3,910,802 | 10/1975 | Wong | 174/128 S |
| 3,963,425 | 6/1976 | Sambrook | 174/128 S |
| 3,982,906 | 9/1976 | Hirai et al. | 75/138 |
| 4,002,504 | 1/1977 | Howe | 29/599 |

OTHER PUBLICATIONS

Rosenblum et al., "High Specific Heat Metals for Use in Superconducting Composites," IEEE Transactions on Magnetics, vol. Mag 13, p. 834, Jan. 1977.

Primary Examiner—Michael W. Ball
Attorney, Agent, or Firm—Dean E. Carlson; William W. Cochran II

[57] ABSTRACT

A composite superconductor formed from a high specific heat ceramic such as gadolinium oxide or gadolinium-aluminum oxide and a conventional metal conductor such as copper or aluminum which are insolubly mixed together to provide adiabatic stability in a superconducting mode of operation. The addition of a few percent of insoluble gadolinium-aluminum oxide powder or gadolinium oxide powder to copper, increases the measured specific heat of the composite by one to two orders of magnitude below the 5° K. level while maintaining the high thermal and electrical conductivity of the conventional metal conductor.

15 Claims, 3 Drawing Figures

HIGH SPECIFIC HEAT SUPERCONDUCTING COMPOSITE

BACKGROUND OF THE INVENTION

The present invention pertains generally to cryogenics and more particularly to composite superconductors.

In superconductor magnets, variations in magnetic fields are a common occurrence which often cause conduction faults in the superconducting filaments. For this reason, these filaments are normally surrounded by a stabilizing metal such as copper or aluminum which is conductive across a wide range of temperatures, including superconducting temperatures. Flux jumps, wire motion, or eddy currents of the copper, produce heat which oftentimes drives the temperature of the superconducting filaments beyond the temperature range for superconducting operation, at which point, these filaments become almost totally nonconductive. The local loss of superconductivity due to such a fault normally produces additional heat from resistance losses or other causes, which, in turn, creates further temperature excursions, thereby creating a runaway undampened temperature excursion cycle. Since the heat transfer process occurs very rapidly in the conductor, i.e., on the order of a few microseconds, the cryogenic fluid is incapable of absorbing the locally produced heat. This is a result of the fact that the heat transfer process between the surface of the superconductor and the helium is slow due to the poor heat conduction attributes of the helium. The cycle can therefore proceed in an undampened mode to produce major interruptions in electron flow. Moreover, the low specific heat of the copper renders this material incapable of absorbing temperature excursions of the superconducting filaments thereby further aiding this undampened runaway temperature excursion cycle.

SUMMARY OF THE INVENTION

The present invention overcomes the disadvantages and limitations of the prior art by providing a high specific heat superconducting composite. This is accomplished by the addition of a few percent of insoluble ceramic to the stabilizer of the composite superconductor. This high specific heat ceramic functions to increase the overall specific heat of the composite superconductor thereby enhancing adiabatic stability by increasing its specific heat. Heat produced in the superconducting filaments is therefore immediately absorbed in the high specific heat ceramic material included within the stabilizer so that the undampened runaway temperature excursion cycle cannot proceed.

It is therefore an object of the present invention to provide a high specific heat superconducting composite.

It is also an object of the present invention to provide a high specific heat superconducting composite which is inexpensive to fabricate.

Another object of the present invention is to provide a high specific heat superconducting composite which is capable of absorbing heat at superconducting temperatures to prevent an undampened runaway temperature excursion cycle.

Other objects, advantages, and novel features of the invention will become apparent from the following detailed description of the invention when considered in conjunction with the accompanying drawings, wherein:

DETAILED DESCRIPTION OF THE PREFERRED EMBODIMENT OF THE INVENTION

Figure 1:
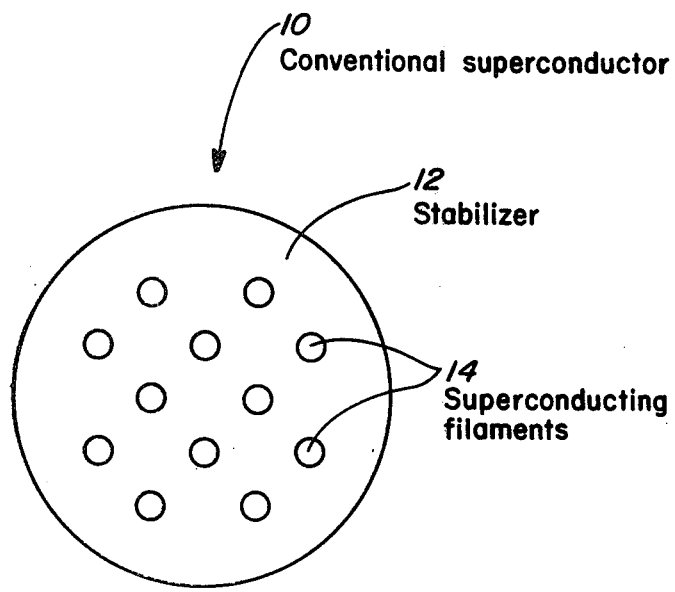
FIG. 1 is a schematic end view of a conventional superconductor.

FIG. 1 discloses a conventional superconductor 10 comprising copper or aluminum stabilizer 12 and superconducting filaments 14. Although FIG. 1 schematically shows twelve superconducting filaments 14, any number of filaments can be utilized within the conventional superconductor 10. Superconductor 10 is normally about the size of a small copper telephone wire and can contain hundreds of superconducting filaments 14.

The arrangement shown in FIG. 1 is utilized to provide stability in superconducting applications such as superconducting magnets. The copper stabilizer 12 provides a conduction path around conduction faults which occur in the superconducting filaments from heat produced due to phenomena such as flux jumps, wire motion or eddy currents. Increases in the temperature of the superconducting filaments 14 above their superconducting range causes the filaments to become virtually nonconductive. The copper stabilizer 12 is designed to carry this current around these conduction faults until enough heat has been dissipated to the surrounding liquid helium medium to lower the temperature of the superconducting filaments to their superconducting temperature range. Sometimes, however, heat cannot be dissipated at a fast enough rate to the surrounding liquid helium cryogenic fluid to prevent temperature rises, and, consequently, the heat generated by the resistance losses produces an undampened runaway temperature excursion cycle resulting in a major conduction fault.

The conventional superconductor 10 as shown in FIG. 1, is constructed by forming a billet of the copper stabilizer 12 having a series of holes running along the length of the billet. A series of superconducting rods formed from a superconducting material are placed within the holes in the billet such that they extend along the entire length of the billet. The billet and superconducting rods are then extruded down to the size of a small copper wire so that the superconducting rods form numerous superconducting filaments as shown in FIG. 1.

Figure 2:
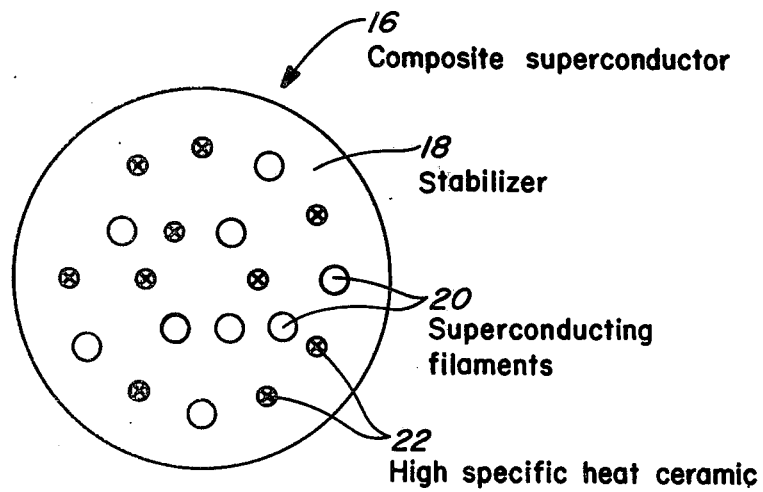
FIG. 2 is a schematic end view of the composite superconductor comprising the preferred embodiment of the invention.

FIG. 2 is a schematic diagram of an end view of the composite superconductor 16 comprising the preferred embodiment of the invention. The composite superconductor 16 comprises a copper stabilizer 18, superconducting filaments 20 and high specific heat ceramic 22. The high specific heat ceramic, as schematically shown in FIG. 2, can be disposed within the composite superconductor 16 by several methods. The first method comprises forming additional holes along the length of the copper billet during the manufacturing process and placing high specific heat ceramic rods or powder in an arrayed pattern between the superconducting rods. When the copper billet is extruded, the high specific heat ceramic rods or powder form high specific heat ceramic filaments running parallel and adjacent to the superconducting filaments 20.

The second method comprises insolubly mixing a finely divided high specific heat ceramic 22 with the copper stabilizer 18 during the formation of the billet. The composite superconductor can then be produced in the conventional manner using superconductor rods and the extrusion process forming the end product schematically shown in FIG. 2. Suitable powder sizes range from $-325$ to $-30 +100$ U. S. Standard mesh of $Gd_2O_3$, $Gd_{1.1}Al_{0.9}O_3$, and $GdAlO_3$. Suitable weight percentages of these ceramics vary from 2.4% to 11%.

Of course, any suitable method for insolubly mixing the ceramic 22 with the stabilizer is acceptable, including the formation of ceramic layers as disclosed in an article entitled "High Specific Heat Metals for Use in Superconducting Composites" by S. S. Rosenblum, H. Sheinberg, and W. A. Steyert, published in IEEE Transactions on Magnetics, Vol. Mag 13, pg. 834, January 1977.

Figure 3:
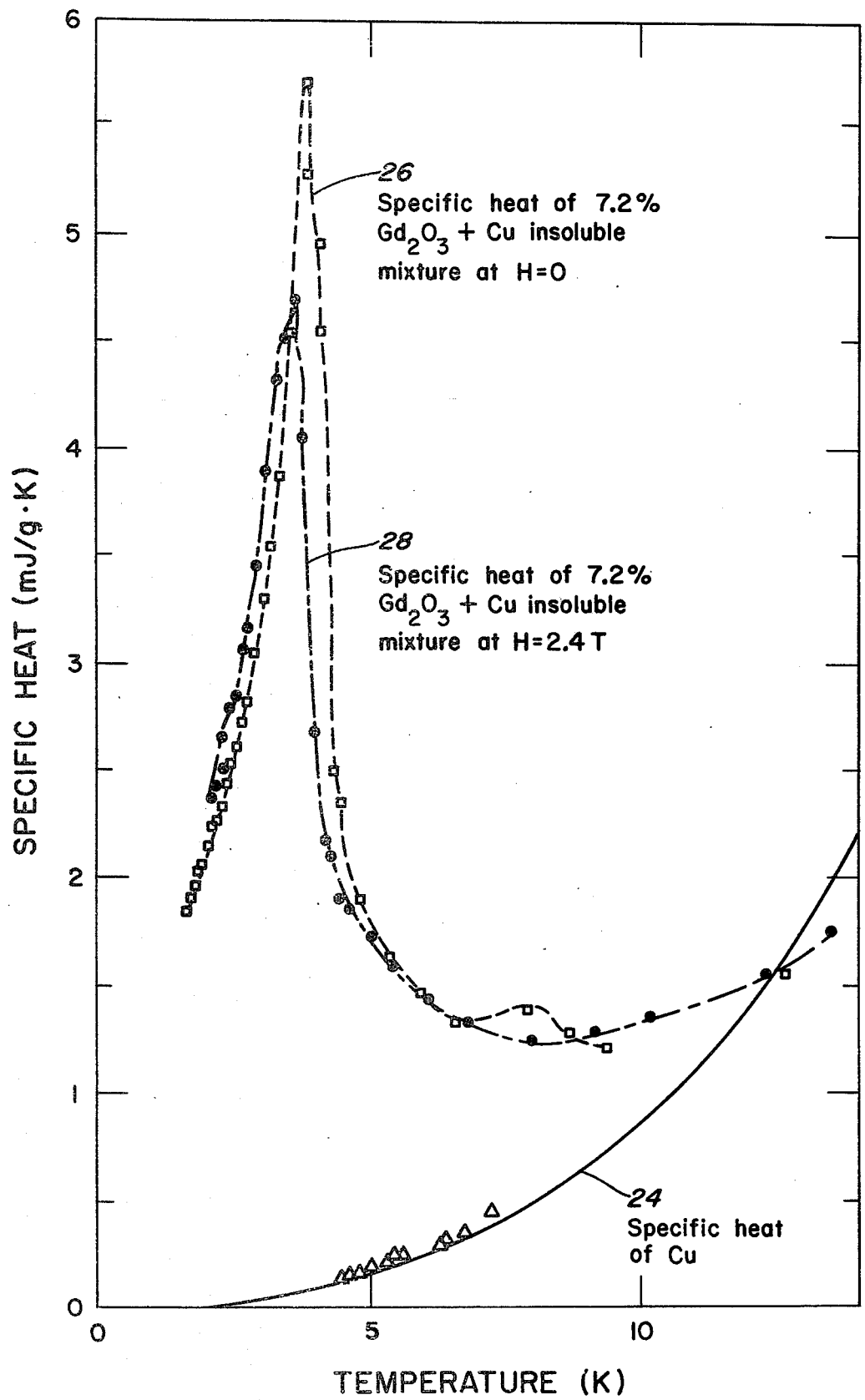
FIG. 3 is a graph of the specific heat of copper and the specific heat of copper insolubly mixed with gadolinium oxide under two different magnetic fields as a function of temperature.

The function of the high specific heat ceramic 22 is to help provide adiabatic stability to the composite superconductor 16. The addition of a few percent of insoluble gadolinium-aluminum oxide or gadolinium oxide increases the measured specific heat of the composite material by one to two orders of magnitude in the superconducting temperature range, i.e., approximately 4° K., while maintaining the high thermal and electrical conductivity of the copper stabilizer 18. This is graphically shown in FIG. 3 wherein curve 24 shows the specific heat of copper from 0° to 15° K. Curves 26 and 28 shown the dynamic increase in specific heat at approximately 4° K. of an insoluble mixture of gadolinium oxide and copper under H fields of 0 and 2.4 T, respectively. This dynamic change in specific heat is a result of magnetic spin specific heat anomalies of many refractory Gd compounds at this temperature range. Across the anomaly, i.e., the temperature range of 2 to 5° K., the entropy increases by R ln 8 per gram-ion of Gd where R is the gas constant. The anomaly in $GdAlO_3$ is an antiferromagnetic transition at 3.7° K. In $Gd_2O_3$ it is a complex combination of crystalline field splitting effects and long range order effects.

Between 3° K. and 4° K. the average specific heat for a 7.2% $Gd_2O_3$ in Cu sample was 4.2 mJ/g-K or about 60 times that of pure copper, while the highest specific heat for the sample was 5.7 mJ/g-K at 3.7° K. and zero applied field. In any event, an insoluble refractory Gd material can be prepared to meet particular requirements with regard to sharpness and location or ordering temperature, particle size, type of transition, and various other parameters. For example, the use of $Gd_{1+x}Al_{1-x}O_3$, $GdAl_{1-x}X_xO_3$ where X is Cr, Mn, Fe, can be utilized to meet particular requirements. Additionally, the use of Al metal in the place of Cu as a stabilizer is a suitable alternative.

The heat transfer process between the superconducting filaments 20 and the surrounding copper stabilizing 18 occurs on a very fast time scale, e.g., in approximately 0.2 $\mu$sec in a 40 $\mu$m thick strip of superconductor. In order to be useful in stabilizing the superconductor, a heat excursion produced in the superconductor due to, for instance, flux jumps or in the copper due to, for instance, wire motion or eddy currents, must be rapidly absorbed by the oxide inclusions. This is, in fact, the function performed by the ceramic 22. With an estimated $10^2$ cm contact area between the copper stabilizer 18 and the high specific heat ceramic 22 in one gram of copper, based upon typical measured thermal boundary resistances between these materials, the time constant associated with the relaxation of the heated copper to the ceramic temperature is on the order of 2 $\mu$sec. This is much faster than propagation of an undampened runaway temperature excursion cycle which occurs on the order of milliseconds.

Therefore, with the ceramic 22 included within the stabilizer, a fault which reduces the magnetic field on the copper or aluminum will actually lower the temperature through adiabatic demagnetization unless there is an appreciable heat input because of the ability of the high specific heat ceramic 22 to rapidly absorb heat. At 4° K. for exmple, a 3% oxide material could absorb the heat required to raise pure copper to 11° K. with no change in temperature.

Although the addition of the high specific heat ceramic 22 reduces the residual resistance ratio of the ceramic copper composite, the conductivity of the composite can be greatly increased by heat treating at approximately 1000° C. in approximately $10^{-4}$ mm of air for approximately 24 hours to oxidize impurities and provide enhanced conduction parameters. These methods for producing high conductivity in copper for low temperature applications is more fully disclosed in an article entitled "A Simple Method for Producing High Conductivity Copper for Low Temperature Application" by S. S. Rosenblum, W. A. Steyert, and F. R. Fickett published in Cryogenics Vol. 17, pages 645–647, Nov. 1977.

The present invention therefore provides a high specific heat superconducting composite which is capable of absorbing heat produced by conduction faults. The addition of the high specific heat ceramic substantially reduces the possibility of an undampened runaway temperature excursion cycle. Mechanical properties of the stabilizer are not degraded by the addition of a few percent of the high specific heat ceramic. The additional cost for material is extremely low, e.g., $1.20 per pound for a 3% ceramic and copper. The ceramic is capable of rapidly absorbing heat such that the temperatures of the superconducting filaments and surrounding stabilizer are maintained, even reduced.

Obviously many modifications and variations of the present invention are possible in light of the above teachings. For example, various high specific heat ceramics can be utilized for the purpose of increasing the overall specific heat of the stabilizer. It is therefore to be understood that within the scope of the appended claims the invention may be practiced otherwise than as specifically described.

What I claim is:

1. A composite for enhancing adiabatic stability of a superconductor stabilizer comprising:
   a substantially pure conductive stabilizer;
   a plurality of ceramic filaments having a high specific heat due to magnetic spin specific heat anomalies at superconducting temperatures when subjected to a predetermined magnetic field, insolubly disposed within said conductive stabilizer to form said composite;
   whereby said ceramic filaments substantially increase the overall specific heat of said composite thereby enhancing the adiabatic stability of said superconductor stabilizer.

2. The composite of claim 1 wherein said ceramic filaments comprise $Gd_2O_3$.

3. The composite of claim 1 wherein said ceramic filaments comprise $GdAlO_3$.

4. A composite superconductor having the properties of adiabatic stability at superconducting temperatures comprising:
 a substantially pure conductive stabilizer;
 a plurality of superconducting filaments disposed within said conductive stabilizer;
 a ceramic material having high specific heat due to magnetic spin specific heat anomalies at superconducting temperatures, insolubly mixed with said stabilizer;
 whereby said ceramic material increases the entropy of said composite superconductor at superconducting temperatures to provide adiabatic stability.

5. The composite superconductor of claim 4 wherein said conductive stabilizer comprises substantially pure copper which is heat treated in air to oxidize impurities for better conduction.

6. The composite superconductor of claim 4 wherein said ceramic material comprises $Gd_2O_3$.

7. the composite superconductor of claim 4 wherein said ceramic material comprises $GdAlO_3$.

8. A method of preparing a composite conductor having high adiabatic stability at superconducting temperatures comprising:
 preparing a substantially pure conductive billet;
 forming a plurality of holes along the length of said billet;
 placing multiplicity of superconducting filaments in a first predetermined number of said plurality of holes;
 placing a multiplicity of ceramic filaments having a high specific heat due to magnetic spin specific heat anomalies at superconducting temperatures in a second predetermined number of said plurality of holes;
 extruding said billet containing said superconducting filaments and said ceramic filaments to a size suitable for use as a superconductor such that said superconducting filaments and said ceramic filaments are insolubly mixed with said billet to form said composite;
 whereby said ceramic filaments function to absorb heat and reduce temperatures produced by conduction faults in said superconducting filaments through adiabatic demagnetization.

9. The method of claim 8 further comprising the step of heat treating said composite in air to oxidize impurities and provide enhanced conduction parameters of said composite.

10. The method of claim 8 wherein said step of placing a multiplicity of ceramic filaments comprises placing a multiplicity of $Gd_2O_3$ ceramic filaments.

11. The method of claim 8 wherein said step of placing a multiplicity of ceramic filaments comprises placing a multiplicity of $GdAlO_3$ filaments.

12. A method of preparing a composite superconductor having high adiabatic stability at superconducting temperatures comprising:
 preparing a finely divided ceramic having a high specific heat due to magnetic spin specific heat anomalies at superconducting temperatures;
 insolubly mixing said finely divided ceramic with substantially pure conductive stabilizer;
 forming a billet from said conductive stabilizer and said ceramic mixture;
 forming a plurality of holes along the length of said billet;
 placing a plurality of superconducting filaments in said plurality of holes;
 extruding said billet containing said superconducting filaments to a size suitable for use as a superconductor;
 whereby said finely divided ceramic functions to absorb heat and reduce temperatures produced by conduction faults in said superconducting filaments through adiabatic demagnetization.

13. The method of claim 12 further comprising the step of heat treating said composite in air to oxidize impurities and provide enhanced conduction parameters of said composite.

14. The method of claim 12 wherein said ceramic comprises $Gd_2O_3$.

15. The method of claim 13 wherein said ceramic comprises $GdAlO_3$.

* * * * *